United States Patent [19]

Jaros

[11] Patent Number: 5,783,875
[45] Date of Patent: Jul. 21, 1998

[54] TOUCH SENSOR CIRCUIT

[75] Inventor: Jeffrey J. Jaros, Beachwood, Ohio

[73] Assignee: The Lamson & Sessions Co., Cleveland, Ohio

[21] Appl. No.: 799,118

[22] Filed: Feb. 11, 1997

[51] Int. Cl.⁶ .................................................. H01H 35/00
[52] U.S. Cl. .................. 307/116; 307/125; 307/126; 307/139; 307/140; 327/517; 324/692
[58] Field of Search .................................. 307/116, 125, 307/126, 139, 140; 116/205; 323/904; 327/517; 345/173; 364/927.64; 379/93.19; 324/610, 692, 119; 340/565; 315/362

[56] References Cited

U.S. PATENT DOCUMENTS

| | | |
|---|---|---|
| 3,666,988 | 5/1972 | Bellis ........................ 315/362 |
| 3,965,465 | 6/1976 | Alexander . |
| 4,016,490 | 4/1977 | Weckenmann et al. . |
| 4,023,052 | 5/1977 | Kroner . |
| 4,081,700 | 3/1978 | Hamilton, II ............... 340/565 |
| 4,099,118 | 7/1978 | Franklin et al. . |
| 4,105,902 | 8/1978 | Iwai et al. . |
| 4,119,864 | 10/1978 | Petrizio . |
| 4,152,629 | 5/1979 | Raupp . |
| 4,159,473 | 6/1979 | Senk . |
| 4,289,980 | 9/1981 | McLaughlin . |
| 4,556,824 | 12/1985 | Cheng ........................ 315/362 |
| 4,613,790 | 9/1986 | Roorda . |
| 4,632,490 | 12/1986 | Von Gunten . |
| 4,651,022 | 3/1987 | Cowley ....................... 307/116 |
| 4,668,876 | 5/1987 | Skarman . |
| 4,701,676 | 10/1987 | Gibson ........................ 315/362 |
| 4,764,708 | 8/1988 | Roudeski . |
| 4,764,717 | 8/1988 | Tucker et al. . |
| 4,988,924 | 1/1991 | Maurer et al. ............... 315/362 |
| 5,066,898 | 11/1991 | Miller et al. ................. 307/116 |
| 5,153,572 | 10/1992 | Caldwell et al. . |
| 5,194,781 | 3/1993 | Konopka ..................... 307/140 |
| 5,291,068 | 3/1994 | Rammel et al. . |
| 5,313,013 | 5/1994 | Suzuki et al. . |

*Primary Examiner*—William M. Shoop, Jr.
*Assistant Examiner*—Peter Ganjian
*Attorney, Agent, or Firm*—Jones, Day, Reavis & Pogue

[57] ABSTRACT

A touch sensor circuit is disclosed for sensing a person's touch and for switching power to an AC load. The touch sensor circuit includes a sense input circuit, logic circuit, power switching circuit and power supply/reference circuit. The power supply and reference circuit tracks the AC line-hot input, and supplies DC power to the circuit. The sense input circuit is configured such that when a person touches the touch input pad, a circuit is created between the positive voltage reference and earth ground, thereby generating an easily detectable voltage swing on an internal sensing node. The logic circuit senses the voltage variation on the sensing node and generates a pulse which toggles power to the power switching circuit and connected load.

18 Claims, 1 Drawing Sheet

TOUCH SENSOR CIRCUIT

BACKGROUND OF THE INVENTION

The present invention is directed toward the field of electronic touch sensor circuits, in particular to a touch sensor circuit for sensing a human touch and for switching AC power to a connected load, such as a string of Christmas lights on a Christmas tree. According to the present invention, a high-reliability touch sensor circuit is provided that includes a power supply that tracks the line-hot AC power input for powering included sense input, logic and switching circuits. The sense input circuit is configured such that when a person touches a touch pad connected to the sense input circuit, a conductive path is established between the line-hot AC power input and earth ground through a resistor divider and the person's body, thereby generating an easily detectable sense signal which causes AC power to be switched to the connected load.

Prior art circuits exist that sense the touch of a person and correspondingly cause some action to occur, such as switching power to a connected load. These prior art circuits suffer from a variety of technical problems, all of which are overcome by the teaching of the present invention.

Prior art touch sensor circuits are essentially composed of two types: (i) charge detection circuits; and (ii) oscillator circuits. For example, U.S. Pat. No. 4,289,980 to McLaughlin shows a typical charge detection touch sensor circuit. According to the teaching of McLaughlin, the touch input pad 36 (where the user's touch is received) is connected to a charge sensing capacitor 34 and an input resistive biasing network 30, 32. The purpose of these RC components is to bias the one-shot multivibrator 28 to a point where it is almost generating a pulse, but not quite. When a person touches the input pad 36, the static charge on the person's body causes a slight increase in the charge stored on the capacitor 34, which trips the one-shot circuit (See, Mclaughlin, U.S. Pat. No. 4,289,980, FIG. 2). McLaughlin actually teaches away from the present invention, by stating that the invention does not use the body contact for a conductive path for current flow (Mclaughlin, Column 1, lines 58–60). By distinction, the present invention uses a sense input circuit configured so that when a person touches the connected touch pad, a conductive path is established between the line-hot AC power input and earth ground, thereby generating an easily detectable sense signal.

Other examples of charge detection circuits include U.S. Pat. No. 4,159,473 to Senk, and U.S. Pat. No. 4,199,864 to Petrizio. Each of these prior art charge detection circuits, like McLaughlin, operate by biasing a capacitor to a particular voltage level, and by sensing the momentary increase in charge stored on the capacitor when a human touches a metallic touch pad connected to the charge storage capacitor. These circuits suffer from a number of problems. First, the input touch sensing circuitry must be biased to a precise voltage level which will not trip the logic circuitry, but which is close enough to the trip level so that when a person touches the pad the incremental charge increase on the detection capacitor caused by the transfer of static charge from the person's body causes the circuit to trigger. Because of this biasing technique, these types of circuits are quite sensitive to variations in component values, fluctuations in AC line voltage, and environmental conditions.

An additional disadvantage of the charge detection circuits is the small voltage amplitude of the trip or sense signal detectable by the logic circuitry. Because the input biasing circuitry of the charge detection circuits is designed to detect small changes in static charge from the person touching the touch pad, the corresponding sense signal that is connected to the logic circuitry is small in amplitude, and therefore is difficult to properly detect. Because of this small amplitude sense signal, these types of circuits routinely suffer from false-detections and mis-detections of a person's touch. By distinction, the present invention overcomes these false and missed detections by generating a large amplitude voltage swing on an internal sense node by referencing the touch sensor circuit to the line-hot AC power input and by utilizing a sense input circuit that creates the large amplitude voltage swing, or sense signal, by creating a conductive path between the line-hot AC power input and earth ground through a resistive divider and the person's body. Another type of touch sensor circuit is the oscillator input circuit. In this type of circuit a person's touch on the touch pad causes a change in the frequency of a reference oscillator, or a change in the amplitude of the pulses from the oscillator, which, when compared to a reference signal or voltage causes a trigger signal to be generated. These types of circuits are superior to the charge detection circuit in terms of reliability (i.e. not missing true touch or generating a false signal), but are much more complex and expensive to design due to the requirement of the oscillator and comparator circuitry.

Therefore, there remains a need for a simple, inexpensive, and reliable touch sensor circuit that senses a person's touch and triggers some action, such as the switching of power to a load.

There remains a further need for a touch sensor circuit that does not require either a complex oscillator circuit or a sensitive charge-detection circuit in order to reliably sense the person's touch.

In addition, there remains a need for a touch sensor circuit that generates a reliable, large amplitude voltage signal swing when the touch pad of the circuit is touched by a person.

There remains a further need for such a touch sensor circuit that generates the large amplitude voltage signal swing by referencing the circuitry of the touch sensor to the line-hot AC power input, and by creating a current path between line-hot AC and earth ground when the person touches the touch pad.

There remains a further need for such a touch sensor circuit where the large amplitude voltage signal, or sense signal, is detected by a one-shot circuit that generates a pulse which turns on and off a power switch that switches power to a load.

There remains a further need for such a touch sensor circuit, where the pulse period from the one-shot circuit is adjustable so as to avoid multiple switching of the power switch.

SUMMARY OF THE INVENTION

The present invention overcomes the problems noted above and satisfies the needs in this field for a high-reliability, inexpensive touch sensor circuit that does not require either an expensive oscillator circuit, or a sensitive charge-detection circuit. According to the disclosed touch sensor circuit, a sense input circuit senses a person's touch and generates a large voltage amplitude sense signal to a logic circuit that detects the sense signal and causes a power switch to apply AC power to a load. The large amplitude sense signal is created by referencing the included power supply, sense input circuit and logic to the line-hot AC power input. This referencing enables a circuit connection between line-hot AC powered reference detection logic and earth ground when the person touches the touch input pad of the sense input circuit.

The present invention includes: (i) a sense input circuit; (ii) a logic trigger circuit; (iii) a power switch; and (iv) a power supply and reference circuit. These elements are configured to operate as described above, and are discussed in more detail in conjunction with the description of the preferred embodiment.

An advantage of the present invention is that by referencing the sense input circuit and the logic trigger circuit to line-hot AC power, a large amplitude sense signal can be generated that is easily detectable, and that overcomes the disadvantages associated with the small amplitude sense signal in the prior art charge-detection circuits.

An additional advantage of the present invention is that it requires only a small number of low cost components, and thereby overcomes the disadvantages of the oscillator-type touch sensor circuits.

Yet another advantage of the present invention is that the logic circuitry can be adjusted such that multiple triggers of the power switch can be avoided if a person touches the touch pad of the sense input circuit for more than a brief moment.

As will be appreciated, the invention is capable of other and different embodiments, and its several details are capable of modifications in various respects, all without departing from the invention. Accordingly, the drawings and description of the preferred embodiment are to be regarded as illustrative in nature and not restrictive.

BRIEF DESCRIPTION OF THE DRAWINGS

The above advantages will become apparent from the following description when read in conjunction with the accompanying drawings wherein.

DETAILED DESCRIPTION OF THE PREFERRED EMBODIMENT

Figure 1:
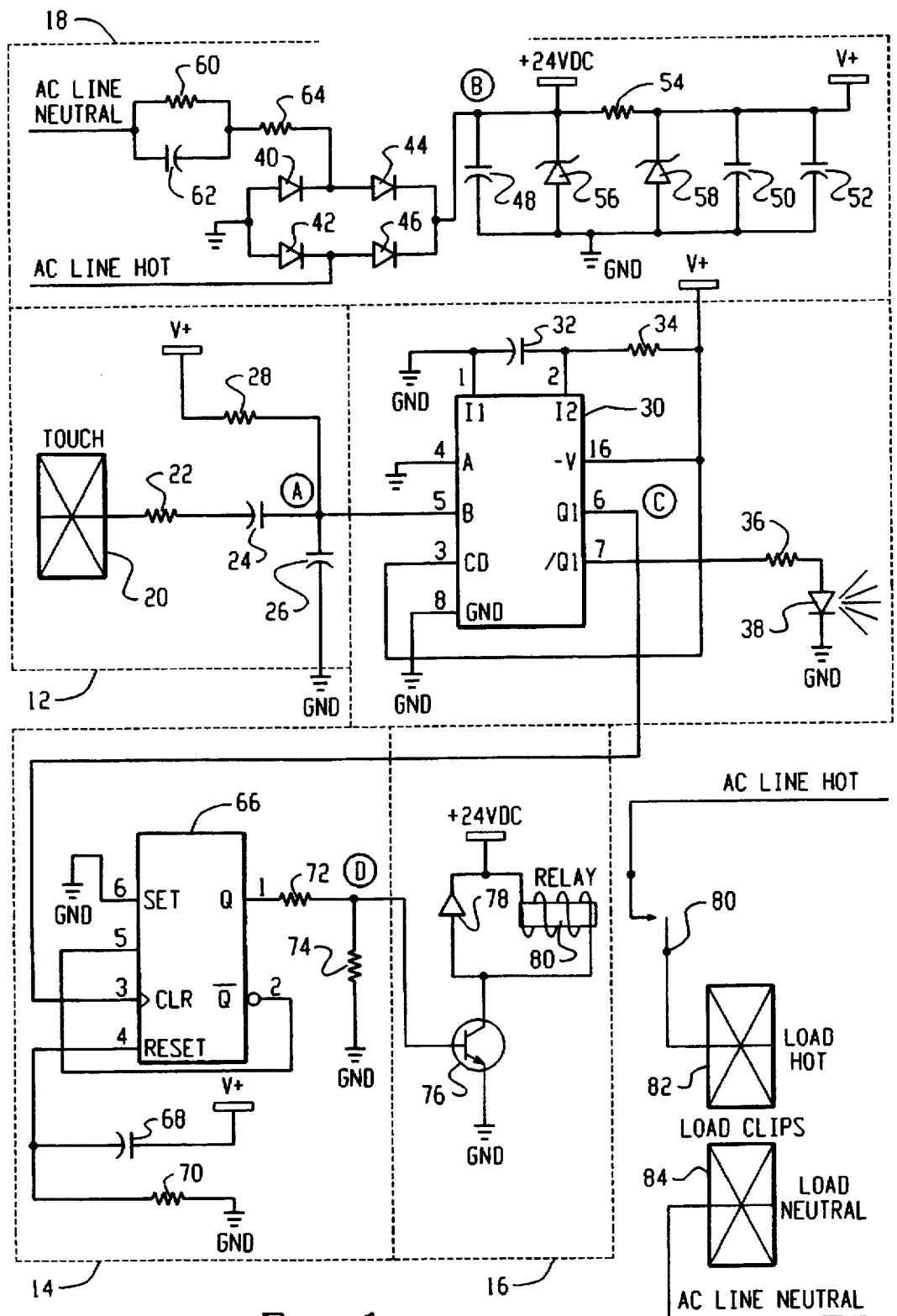
FIG. 1 is a block diagram of a circuit according to the present invention.

Referring now to the drawings, FIG. 1 sets forth a detailed circuit schematic according to the present invention. The touch sensor circuit set forth in FIG. 1 is composed of four major elements: (i) sense input circuit 12; (ii) logic trigger circuit 14; (iii) power switching circuit 16; and (iv) power supply and referencing circuit 18.

Before discussing the sensing, logic and switching circuitry, it is important to understand how power is supplied to these elements of the touch sensor circuit. The power supply and reference circuit 18 is connected to line-hot and line-neutral AC power lines such that it tracks the line-hot AC power input. The AC power input lines are connected to respective sides of a full-wave bridge rectifier circuit composed of diodes 40, 42, 44 and 46, in order to generate a full-wave rectified signal at node B, and provide proper circuit referencing. Capacitors 48, 50, 52, resistor 54, and zener diodes 56 and 58 are then used to generate the positive and ground DC reference level at V+ and GND. The V+ level follows the AC line-hot input, although it is one diode drop in voltage below the voltage level present at the AC line-hot input. The GND voltage level follows the V+ level, but is 24 VDC lower, as set by the clamping voltage of one of the zener diodes. In this manner a positive and ground DC reference voltage are generated that track the line-hot AC input. These reference voltages are used to supply DC power to the remainder of the circuit, and in this manner the entire touch sensor circuit is referenced to the line-hot AC input. Resistors 60, 64 and capacitor 62, connected between the AC line neutral and one side of the bridge rectifier, are used to charge up the power supply when AC power is applied to the circuit.

A more detailed discussion of the operation of the voltage reference circuitry, and how the full-wave rectified and positive and ground reference signals are generated is not necessary as the operation of this circuitry is well known in the field of power electronics. In the preferred embodiment of the present invention diodes 40, 42, 44 and 46 are preferably type IN4003 diodes, capacitor 48 has a value of 47 micro-farads, capacitor 50 has a value of 47 micro-farads, capacitor 52 has a value of 0.1 micro-farads, zener diode 56 is preferably a 1 watt, 24 Volt zener, and zener diode 58 is preferably a 0.5 watt 9.1 volt zener. Resistor 60 preferably has a value of 1 mega-ohm, resistor 64 has a value of 220 ohms, and capacitor 62 is preferably a 250 volt, 1 micro-farad capacitor.

The sense input circuit 12 is composed of a touch input pad 20; RC current limiting components 22, 24; filter capacitor 26; and pull-up resistor 28. The touch input pad 20 is preferably a metallic or other type of conductive plate with little resistance. Touch input pad 20 is connected through RC current limiting components 22, 24 to node A, the sense node. Node A is the electrical point of the sense input circuit where the sense signal is sensed and acted upon by the logic circuitry. This node serves as the input to the logic trigger circuit 14, and is the point where the large amplitude voltage signal, or sense signal, is generated. Also connected to node A is pull-up resistor 28, which pulls the node A voltage level to the positive DC reference voltage V+ when no touch is present at the touch input pad 20. Also connected to node A is filter capacitor 26 which serves to suppress noise on the input line (node A) to the logic circuit 14. Filter capacitor 26 is connected between node A and the ground DC reference voltage GND.

When no touch is present at the touch pad 20 resistor 28 pulls the voltage at the sense output node (node A) to the positive reference level V+, which tracks the line-hot AC power input. When a person touches the touch pad 20, a conductive path is created between the series connection of the positive reference level V+, resistor 28, capacitor 24, resistor 22, the person, and earth ground. As this connection is made between line-hot AC power and earth ground, current flows through the above circuit and through the person's body, but is limited by the resistors 22, 28 and capacitor 24 to a safe level as determined by UL listing. The current flow through resistors 22, 28 causes the voltage at node A to drop several volts, thus generating the easily detectable sense signal. In the preferred embodiment of the present invention, resistor R22 has a value of 2 mega-ohms, capacitor 24 has a value of 0.1 micro-farads, capacitor 26 has a value of 0.001 micro-farads, and resistor 28 has a value of 1.2 mega-ohms.

Logic circuit 14 is composed of one-shot logic gate 30, RS flip flop (or latch) 66, and several passive RC components, including the initial condition setting components 68, 70. The one-shot logic gate input is connected to node A, the sense node, and triggers (i.e. generates a pulse) on a down-going voltage edge at node A. As described above, when a person touches the touch pad 20, the circuit connection to earth ground through the person's body causes a large negative going voltage drop at node A. The edge of this negative going drop is detected by the one-shot 30, and causes a pulse to be generated on the output pin Q of the one-shot 30, node C.

The duration of the pulse generated by the one-shot 30 is adjustable via the component values of resistor 34 and capacitor 32. This is useful in avoiding multiple pulses from being generated by the one-shot when a person touches the touch pad 20 for too long a period of time, thereby causing a 60 Hz "pulse train" that turns the switched load on and off many times in a very short period.

The trigger pulse generated on node C is input to the clock input signal of RS flip flop 66, which is configured to toggle its output pin Q from low to high whenever a clock pulse is present on the clock input signal (CLK). The Q output of the flip flop 66 is connected through voltage dropping resistors 72, 74 to the power switching circuit 14.

The power switching circuit 14 is composed of NPN bipolar transistor 76, normally closed relay 80, and load clips 82, 84. The base of the bipolar transistor is connected to the Q output of the flip flop 66 through voltage dropping resistors 72, 74. The collector of bipolar transistor 76 is connected to the coil of normally open relay 80.

When power is initially applied to the touch sensor circuit resistor 70 and capacitor 68 reset the RS flip flop 66 such that the output of the flip flop is low. Since the base of the NPN bipolar transistor is low the transistor will be off, and the relay will be open. When the first trigger pulse is applied to the clock input of the flip flop 66, the flip flop's Q-output transitions high. The high signal on the Q-output causes the bipolar transistor 76 to turn on and pull current through the coil of relay 80, thereby closing the relay switch and applying AC power to the load connected to load clips 82, 84. The next pulse generated by the one-shot 30 will toggle the Q output of the flip flop low, thereby returning the touch sensor circuit to its initial state, with the relay open and no AC power flowing through the load.

In the preferred embodiment of the present invention the one-shot is preferably a Motorola MC14538, resistor 34 has a value of 1 mega-ohms, capacitor 32 has a value of 0.1 microfarads, the flip flop is preferably a 4013 type device, resistor 72 has a value of 20 kilo-ohms, resistor 74 has a value of 10 kilo-ohms, transistor 76 is a type 2N39304 NPN bipolar transistor, capacitor 68 has a value of 0.1 microfarads, resistor 70 has a value of 510 kilo-ohms, resistor 36 has a value of 1000 ohms, and diode 78 is preferably a 1N4934. These values and component types, as well as the other specific component values and device types listed above are merely examples of individual circuit components that could be used with the present invention and should not be construed as limiting the invention to either the specific component value, or to the specific type of device set forth.

A preferred embodiment of the touch sensor circuit of the present invention is set forth in FIG. 1, the elements and connections of which are described in detail above. The touch sensor circuit enters its initial state when AC power is applied to the circuit. As AC power is applied, voltage reference sub-circuit 18 charges up through resistors 60, 64 and capacitor 62 to generate the DC voltages (V+, GND) that are referenced to AC line-hot, and that supply DC power to the remainder of the circuit. At the same time that AC power is applied to the touch sensor circuit, the flip flop 66 is reset by a momentary high signal on its reset line. This signal decays to a low signal level as capacitor 68 is charged up through resistor 70. Since the output of the RS flip flop 66 is reset low, transistor 76 will be off, and the normally open relay 80 will be open. Assuming that a person is not touching the touch pad 20 of the sense input circuit 12, node A will be pulled to the V+ positive voltage level through resistor 28. This high DC level at node A will prevent the one-shot 30 from generating a trigger pulse on node C.

When a person touches the touch pad 20, a circuit is created between the V+ positive reference level (which is essentially the same as the AC line-hot level) through resistors 28 and 22, the person's body, and earth ground. The current flow through this circuit causes a multi-volt negative going edge at node A which is detected by the one-shot 30 and which causes the one-shot 30 to generate a pulse at node C, the period of the pulse being determined by external components 32, 34. At the same time, the one-shot flashes the LED 38 to indicate a sensed touch.

The trigger pulse at node C toggles the RS flip flop (latch), causing the Q output of the flip flop 66 to go high. This in turn causes the NPN bipolar transistor 76 to turn on and energize the relay 80 into its closed position, thereby allowing AC power to be applied to the load through the load clips 82, 84. The next touch on the touch pad 20 will cause another pulse to be generated by the one-shot, which toggles the latch 66, thereby returning the touch sensor circuit to its initial state. In this manner power can be applied and removed from a load using a simple touch input circuit that generates a reliable multi-volt sense signal that is easily detectable.

By way of example, the load could be a string of Christmas lights for a Christmas tree, and the touch pad could be a metallic ornament that is placed somewhere in the tree. In this manner, and using the present invention, when a person touches the metallic ornament power is applied to the lights, but if the lights are already on, power is removed from the lights. By using the circuit of the present invention, a reliable touch sensor system is provided which overcomes the disadvantages of both the charge-detection circuits and the oscillator circuits of the prior art.

Having described in detail the preferred embodiment of the present invention, including its preferred mode of operation, it is to be understood that this operation could be carried out with circuitry different than the circuitry specifically described. This preferred embodiment is presented only by way of example and is not meant to limit the scope of the present invention which is defined by the following claims.

What is claimed:

1. A touch sensor circuit comprising:
   a touch input pad for receiving a person's touch;
   a power switching circuit for applying power from an AC power source to a load when the touch input pad is touched by a person, wherein the AC power source includes line-hot and line-neutral inputs; and
   a sense input circuit coupled between the touch input pad and the power switching circuit, wherein the sense input circuit is referenced to the line-hot input of the AC power source so that when a person touches the touch input pad, a conductive path is established between the line-hot input and earth ground through the sense input circuit and the person's body, thereby generating a detectable sense signal that triggers the power switching circuit to apply AC power to the load.

2. The touch sensor circuit according to claim 1, further comprising:
   a DC reference circuit coupled to the AC power source, having AC to DC conversion circuitry that generates positive and ground DC voltage references that track the line-hot AC input, the DC reference voltages coupled to the sense input circuit and the power switching circuit, wherein the sense input circuit includes a pull-up resistor connected between a sense node and the positive DC reference voltage.

3. The touch sensor circuit according to claim 2, wherein the power switching circuit includes a one-shot trigger circuit, flip flop and relay.

4. The touch sensor circuit according to claim 3, wherein the one-shot trigger circuit is connected to the sense node of the sense input circuit, and wherein the one-shot trigger circuit detects a voltage drop on the sense node corresponding to a person touching the touch pad and generates a trigger pulse on its output.

5. The touch sensor circuit according to claim 4, wherein the flip flop input is connected to the output of the one-shot trigger circuit and the flip flop output is connected to the relay.

6. The touch sensor circuit according to claim 5, wherein the pulse generated by the one-shot trigger circuit toggles the output of the flip flop, thereby causing the relay to open and close.

7. The touch sensor circuit according to claim 6, wherein the relay is connected between AC power and the load, such that when the one-shot toggles the output of the flip flop, the relay successively applies and removes power from the load.

8. The touch sensor circuit according to claim 4, wherein the period of the trigger pulse generated by the one-shot trigger circuit is adjustable.

9. The touch sensor circuit according to claim 2, wherein the sense signal is generated by the sense input circuit at the sense node when a person touches the touch pad, the sense signal being generated by the voltage drop across the pull-up resistor from the circuit connection between the line-hot AC input and earth ground through the person's body.

10. The touch sensor circuit according to claim 2, wherein the sense input circuit further includes a current limiting resistor connected between the touch input pad and the sense node.

11. The touch sensor circuit according to claim 2, wherein the DC reference circuit includes a diode bridge rectifier and a reference-generating circuit for providing the positive and ground DC reference voltages that track the line-hot AC power input.

12. The touch sensor circuit according to claim 11, wherein the DC reference circuit further includes an RC network connected between the line-neutral AC input and the diode bridge rectifier.

13. A touch sensor circuit for switching a source of AC power having line-hot and line-neutral AC power inputs to a load, the circuit comprising:

a touch input pad;

a sense input circuit connected to the touch input pad and referenced to the line-hot AC power input, so that when a person touches the touch input pad, a conductive path is established between the line-hot input and earth ground through the sense input circuit and the person's body, thereby generating a detectable sense signal;

a logic circuit connected to the sense input circuit for generating a trigger pulse in response to the sense signal; and a power switch connected to the logic circuit that switches AC power to a load.

14. The touch sensor circuit according to claim 13, further comprising a DC power supply that converts AC power to DC voltage references that track the line-hot AC input, wherein the voltage references supply DC power to the sense input circuit, logic circuit and power switch.

15. The touch sensor circuit according to claim 14, wherein the sense input circuit includes a pull-up resistor connected between the positive DC reference voltage and a sense node, and wherein the touch input pad is connected to the sense node.

16. The touch sensor circuit according to claim 15, wherein the sense input circuit includes a current limiting resistor between the touch input pad and the sense node.

17. The touch sensor circuit according to claim 15, wherein the sense signal is generated at the sense node by the current that flows from the positive DC reference voltage through the pull-up resistor and the person's body to earth ground when a person touches the touch input pad.

18. A touch sensor circuit comprising:

means for sensing a person's touch and for generating a sense signal in response to the person's touch;

means for detecting the sense signal and for switching input AC power to a load, wherein the input AC power includes line-hot and line-neutral inputs; and means for converting input AC power to DC reference voltages that track the line-hot input, and that supply power to the means for sensing, so that when a person touches the means for sensing, current flows from the line-hot AC power input through the person's body to earth ground, thereby generating the sense signal.

* * * * *